United States Patent [19]

Matsuoka et al.

[11] Patent Number: 5,006,908
[45] Date of Patent: Apr. 9, 1991

[54] EPITAXIAL WURTZITE GROWTH STRUCTURE FOR SEMICONDUCTOR LIGHT-EMITTING DEVICE

[75] Inventors: Takashi Matsuoka; Toru Sasaki, both of Ibaragi, Japan

[73] Assignee: Nippon Telegraph and Telephone Corporation, Tokyo, Japan

[21] Appl. No.: 479,068

[22] Filed: Feb. 12, 1990

[30] Foreign Application Priority Data

Feb. 13, 1989 [JP] Japan .................................. 1-33279

[51] Int. Cl.$^5$ .............................................. H01L 33/00
[52] U.S. Cl. ............................................. 357/17; 357/60; 357/61
[58] Field of Search ............................. 357/17, 60, 61

[56] References Cited

U.S. PATENT DOCUMENTS

| | | | |
|---|---|---|---|
| 4,153,905 | 5/1979 | Charmakadze et al. | 357/16 |
| 4,396,929 | 8/1983 | Ohki et al. | 357/61 X |
| 4,408,217 | 10/1983 | Kobayashi et al. | 357/61 X |
| 4,614,961 | 9/1986 | Khan et al. | 357/61 X |
| 4,616,248 | 10/1986 | Khan et al. | 357/61 X |

FOREIGN PATENT DOCUMENTS

| | | |
|---|---|---|
| 52-23600 | 2/1977 | Japan . |
| 54-119400 | 9/1979 | Japan . |
| 55-3834 | 1/1980 | Japan . |
| 57-10280 | 1/1982 | Japan . |
| 59-57997 | 4/1984 | Japan . |
| 60-26079 | 6/1985 | Japan . |
| 62-30696 | 2/1987 | Japan . |
| 62-119196 | 5/1987 | Japan . |
| 62-119940 | 6/1987 | Japan . |
| 63-22591 | 1/1988 | Japan . |
| 63-188938 | 8/1988 | Japan . |
| 64-17484 | 1/1989 | Japan . |
| 61-18184 | 1/9186 | Japan . |

OTHER PUBLICATIONS

Boulou et al., "Light-Emitting Diodes Based on GaN," *Philips Tech., Rev.*, 37, 1977, No. 9/10, pp. 237–240.

*Primary Examiner*—William Mintel
*Attorney, Agent, or Firm*—Blakely, Sokoloff, Taylor & Zafman

[57] ABSTRACT

An epitaxial growth structure for a semiconductor light-emitting device includes a sapphire substrate having a (01$\bar{1}$0) face (substantially M face), and a wurtzite type Group III nitride mixed crystal semiconductor single crystal film epitaxially grown on the substrate. A semiconductor light-emitting device includes a sapphire substrate having a (01$\bar{1}$0) face (substantially M face), a wurtzite type Group III nitride mixed crystal semiconductor single crystal film epitaxially grown on the substrate, an insulating film formed on the single crystal film, and a metal electrode formed on the insulating film.

7 Claims, 8 Drawing Sheets

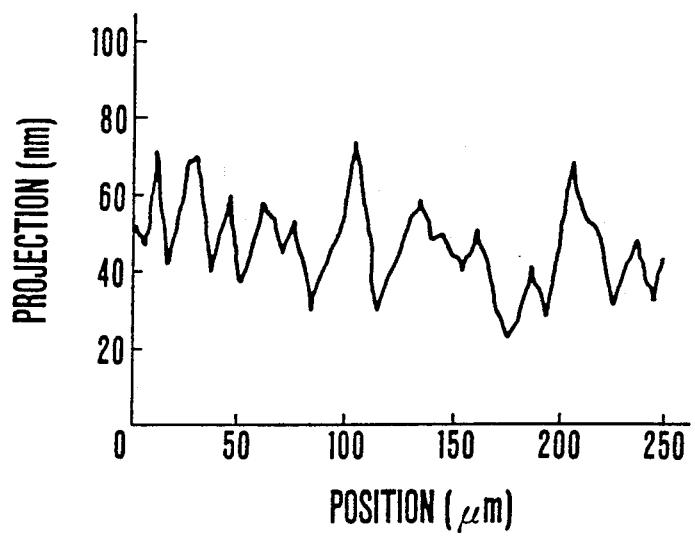
F I G. 4A
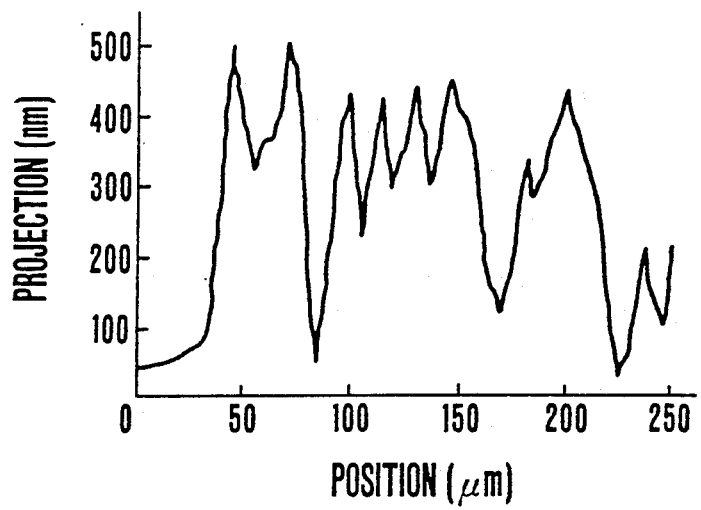
F I G. 4B
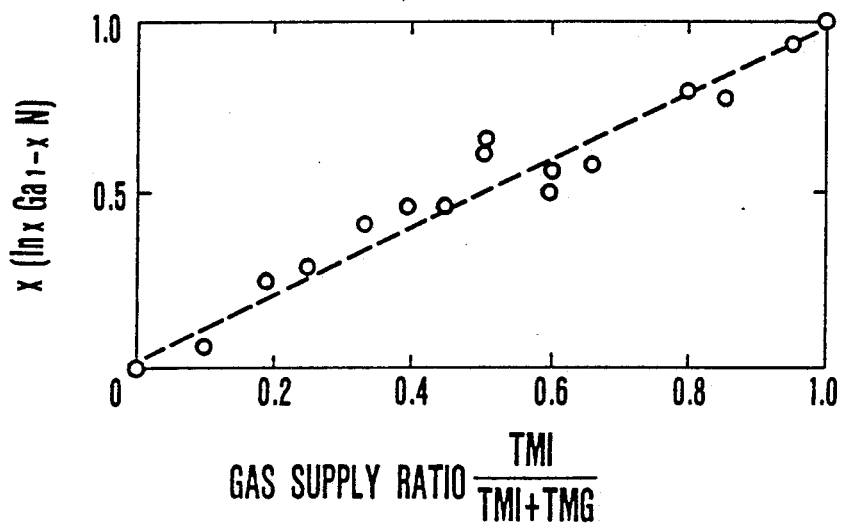
F I G. 8

10μm

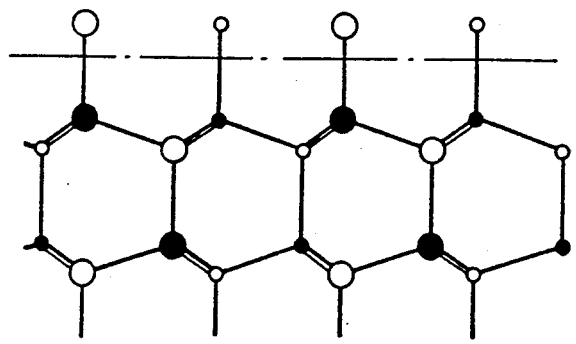
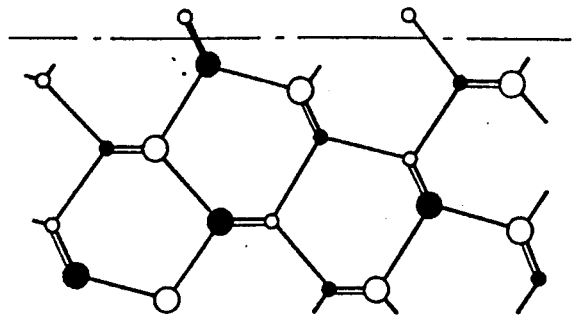
FIG.1A  FIG.1B
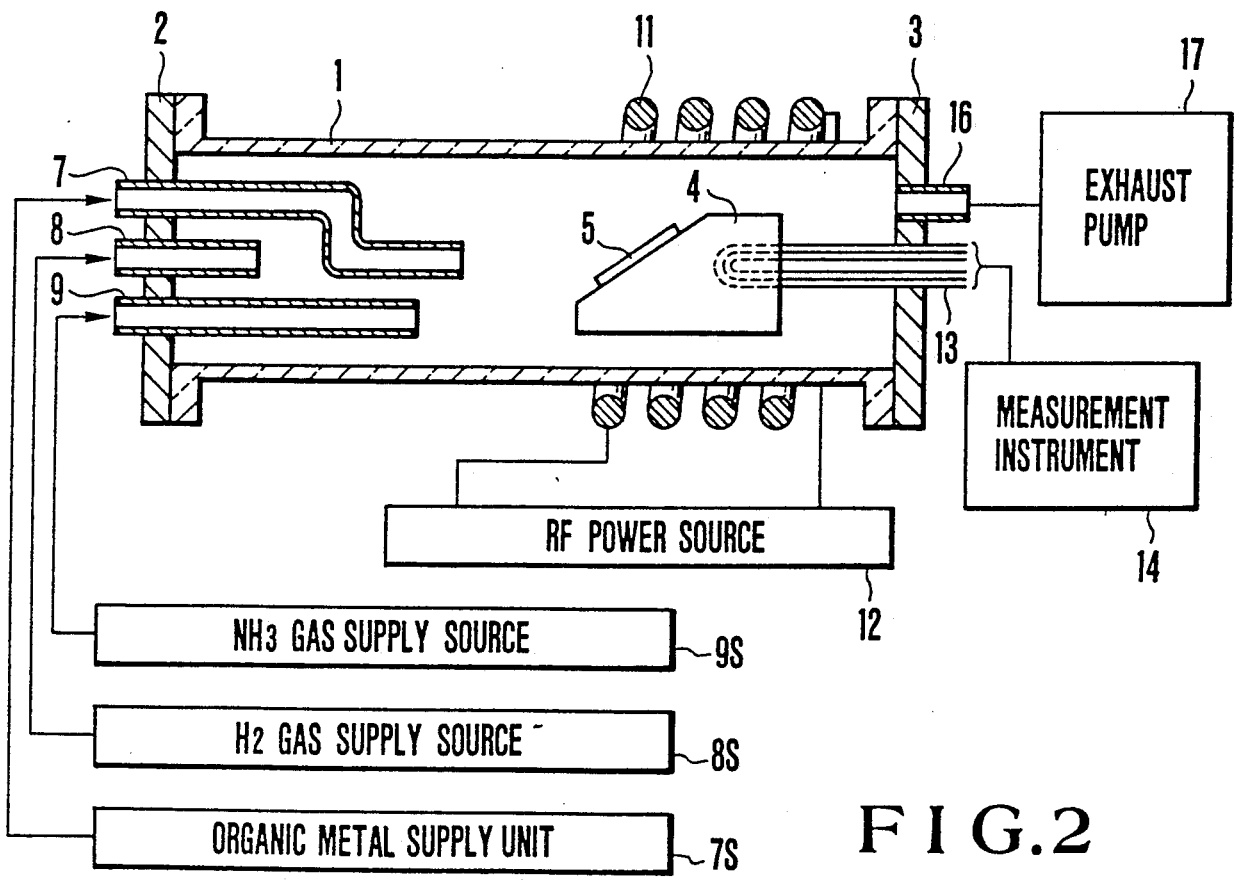
FIG.2

EPITAXIAL WURTZITE GROWTH STRUCTURE FOR SEMICONDUCTOR LIGHT-EMITTING DEVICE

BACKGROUND OF THE INVENTION

The present invention relates to an epitaxial growth structure for a semiconductor light-emitting device using a sapphire substrate, and a semiconductor light-emitting device using the same.

As a light-emitting device material in a region of wavelengths (wavelength=480 nm or less) shorter than that of blue, various types of light-emitting devices using $ZnSe_xS_{1-x}$ ($0 \leq x \leq 1$), SiC, and GaN have been proposed, and their samples have been manufactured.

A sapphire (0001) face (C face) or a ($2\bar{1}\bar{1}0$) face (A face) is used for GaN.

In order to realize a high-efficiency light-emitting device, the material is ideally a direct transition semiconductor material, enables current injection by a p-n junction, and can manufacture a double hetero (DH) structure in which a light-emitting layer and p- and n-type cladding layers are lattice-matched. Problems of the above light-emitting device will be described below.

(a) $ZnSe_xS_{1-x}$ ($0 \leq x \leq 1$)

Film formation is attempted on a GaAs substrate by an MOVPE (Metalorganic Vapor Phase Epitaxy) method, an MBE (Molecular Beam Epitaxy) method, and the like. In these methods, by changing a composition ratio of Se to S, a lattice constant and a band gap energy can be changed. In this material system, however, the band gap energy is solely determined if the lattice constant is determined. Therefore, no DH structure cannot be formed under lattice matching conditions.

(b) SiC

A p-n junction can be formed by doping a suitable impurity. This material, however, is an indirect transition semiconductor. In addition, no DH structure can be formed since no materials having the same lattice constant and different band gap energies are available.

(c) GaN on Sapphire C- or A-face Substrate

Since N holes serving as a donor are present at a high concentration, no p-type material is realized. That is, all of announced light-emitting devices have a structure (MIS type) in which a metal electrode is formed on an n-type GaN thin film via a GaN layer semi-insulated by Zn or Mg doping. This light-emitting device utilizes a phenomenon in which, after a high electric field is applied to the Zn- or Mg-doped layer to ionize a light emission center, light is emitted when electrons drop to their original energy level. A light-emitting device using GaN grown directly on the substrate has a low quantum efficiency. This GaN crystal has the following problems.

① Significant three-dimensional growth is caused (a three-dimensional pattern corresponding to a film thickness).

→Severe problems in manufacturing a light-emitting device having a multilayered structure are posed, i.e., an electric field cannot be uniformly applied since the film thickness is not uniform, and carrier injection cannot be performed, thereby largely degrading the device characteristics.

② N hole (serving as a donor) concentration is high (carrier concentration = $10^{18}$ to $10^{19}$ cm$^{-3}$)

→It becomes difficult to perform conductivity control, and a light absorption coefficient in the material is significantly increased.

③ Large lattice mismatching, or noncoincidence of crystallographic symmetries between a substrate and an epitaxial growth film (Table 1; Note that the lattice mismatching is obtained by comparing minimum period units of crystals).

TABLE 1

| Orientation Relationship | | Lattice Misalignment | Substrate-Epitaxial Film Interface Symmetry |
|---|---|---|---|
| (0113)GaN/Sapphire M Face | [0$\bar{3}\bar{3}$2]GaN//[2$\bar{1}\bar{1}$0]Sapphire | −2.6% | Coincidence |
| | [2$\bar{1}\bar{1}$0]GaN//[000$\bar{1}$]Sapphire | 1.9% | |
| (0001)GaN/Sapphire C Face | [2$\bar{1}\bar{1}$0]GaN//[01$\bar{1}$0]Sapphire | 13.8% | Coincidence |
| | [01$\bar{1}$0]GaN//[2$\bar{1}\bar{1}$0]Sapphire | 13.8% | |
| (0001)GaN/Sapphire A Face | [01$\bar{1}$0]GaN//[01$\bar{1}$0]Sapphire | −0.4% | Noncoincidence |
| | [2$\bar{1}\bar{1}$0]GaN//[0001]Sapphire | 1.9% | |
| ($2\bar{1}\bar{1}0$)GaN/Sapphire R Face | [01$\bar{1}$0]GaN//[2$\bar{1}\bar{1}$0]Sapphire | 13.8% | Coincidence |
| | [0001]GaN//[0$\bar{1}$11]Sapphire | 1.1% | |

Note that Table 1 compares lattice mismatching and crystallographic symmetry between a sapphire substrate and a GaN film with respect to a substrate orientation.

→An improvement in crystallinity is limited, resulting in a low quantum efficiency, a short living, and a low optical output of a light-emitting device.

The above items ① and ② are caused by the following reasons.

① In growth on the C face, the number of nuclear formation sites is small, and coarsely formed growth nuclei individually form hillocks.

② The GaN film on the C- and A-face substrate is (0001)-axis oriented to be a Ga termination. As a result, an adhesion coefficient of N is small and an N hole concentration is high on the Ga termination face. This state is schematically shown in FIG. 1A.

Referring to FIGS. 1A and 1B, solid circles represent Ga, and open circles represent N. The symbols "●" and "O" represent atoms on the drawing surface, and "●" and "O" represent atoms in front of the drawing surface. In addition "—" indicates that only parallel bonds are present on the drawing surface, and "=" indicates that an atom on the drawing surface is bonded to atoms before and behind the drawing surface.

In order to solve the problems ① and ② a method in which AlN is used as a buffer layer between sapphire and GaN is reported. AlN serves as a buffer layer to reduce an interface energy between sapphire and GaN to accelerate dense nuclear formation. As a result, the problem ① is almost solved, and the problem ② is partially solved. Since, however, the problems ② and ③ are essential problems in this system, the method using the AlN buffer layer is unsatisfactory in a practical device.

As described above, none of blue light-emitting devices currently proposed is practical mainly because the crystallinity of an active layer is insufficient.

SUMMARY OF THE INVENTION

It is, therefore, a principal object of the present invention to provide an epitaxial growth structure for a semiconductor light-emitting device flatter than a conventional structure on a sapphire substrate.

It is another object of the present invention to provide an epitaxial growth structure for a semiconductor light-emitting device having less crystal defects (a low etch pit density).

It is still another object of the present invention to provide an epitaxial growth structure for a semiconductor light-emitting device having a high luminous efficiency and a semiconductor light-emitting device using the same.

It is still another object of the present invention to provide an epitaxial growth structure for a semiconductor light-emitting device capable of forming a p-n structure which facilitates injection of a current and a semiconductor light-emitting device using the same.

It is still another object of the present invention to provide a semiconductor light-emitting device having a wide color range of ultraviolet to orange regions.

It is still another object of the present invention to provide an epitaxial growth structure for a semiconductor light-emitting device having a double hetero structure capable of forming lattice matching with a substrate and a semiconductor light-emitting device using the same.

In order to achieve the above objects of the present invention, there is provided an epitaxial growth structure for a semiconductor light-emitting device, comprising a sapphire substrate having a substantially $(01\bar{1}0)$ face (M face), and a wurtzite type Group III nitride mixed crystal semiconductor single crystal film epitaxially grown on the substrate.

In addition, there is provided a semiconductor light-emitting device comprising a sapphire substrate having a substantially $(01\bar{1}0)$ face (M face) a wurtzite type Group III nitride mixed crystal semiconductor single crystal film epitaxially grown on the substrate, an insulating film formed on the single crystal film, and a metal electrode formed on the insulating film.

Basic features of the present invention and a difference between the present invention and conventional techniques will be summarized below.

The problems ① and ② described in the above item (c) related to "problems in conventional techniques" can be solved by an M face. This will be described below.

ABOUT PROBLEM ①

In crystal growth on a substrate, a nuclear formation site concentration depends on a face index of the substrate before the substrate is covered with a film and on a face index of a growth face of the film thereafter. In either case, the nuclear formation site concentration is decreased as the index face is decreased and increased as the index face is increased. When no sufficient nuclear formation sites are present on the substrate surface or the grown film surface, coarsely formed growth nuclei are individually grown to be hillocks. Therefore, projections on the surface become larger than those formed when sufficient nuclear formation sites are present.

A C face ($(0001)$ face) as a minimum index face is atomically very flat and can hardly cause nuclear formation. The $(0001)$-axis oriented GaN is grown on the sapphire C face, and a $(0001)$ face becomes a growth face. The flatness on the surface of a GaN film grown on the sapphire C face is poor for the following reason. That is, although sapphire A and R faces have higher face indexes than those of the C face, their face indexes on growth faces are as low as $(0001)$ and $(2\bar{1}\bar{1}0)$, respectively. Therefore, nuclear formation does not easily occur as a $(01\bar{1}3)$ face grown on the M face. For this reason, the flattest growth face is obtained on the M face.

ABOUT PROBLEM ②

In FIGS. 1A and 1B, the generally used C face and the M face of the present invention are compared with each other to show bonding states between N atoms and Ga atoms on the surfaces. An N atom on the surface of a $(0001)_{Ga}$ face is bonded to only one Ga atom, while that on a $(01\bar{1}3)$ face is bonded to one to two Ga atoms. Therefore, N holes are formed more firmly on the M face than on the C face. As a result, a donor concentration of the M face becomes lower than that of the C face.

In order to change an n-type crystal to be a p-type crystal, a p-type impurity at a higher concentration than that of donors existing in the crystal must be doped. Conventionally, conductivity type control cannot be performed in GaN since the crystallinity is largely degraded when a p-type impurity at a higher concentration than that of donors present at a high concentration ($10^{18}$ to $10^{19}$ cm$^{-3}$) in a crystal is doped. Since, however, the epitaxial growth structure of the present invention can reduce an N vacancy concentration, a conductivity type can be controlled by doping a p-type impurity.

In addition, as described above, a DH structure cannot be manufactured in accordance with the items (a) and (b) related to "problems of conventional techniques". In $In_xGa_yAl_{1-x-y}N$, however, this problem can be solved because a band gap energy can be changed while a lattice constant is kept unchanged by changing a composition ratio between In, Ga, and Al. If a lattice constant of each layer constituting a DH structure largely differs from that of a sapphire M face, the DH structure is manufactured via an interlayer for relaxing lattice mismatching. If each layer of the DH structure is lattice-matched with the sapphire M face, a high-efficiency light-emitting device can be realized without forming an interlayer.

BRIEF DESCRIPTION OF THE DRAWINGS

FIGS. 1A and 1B are views showing atom arrangement models having growth surfaces of a $(0001)_{Ga}$ face and a $(01\bar{1}3)$ face, respectively;

FIG. 2 is a view showing an arrangement of a film growing apparatus using an organic metal as a material, used in crystal growth to carry out the present invention;

FIGS. 4A and 4B are graphs showing surface projections on the sapphire M and C faces, respectively, measured by a profilometer;

FIG. 8 is a view showing a relationship between a composition of an $In_xGa_{1-x}N$ film and a Group III gas supply ratio;

DETAILED DESCRIPTION OF THE PREFERRED EMBODIMENTS

Figure 13:
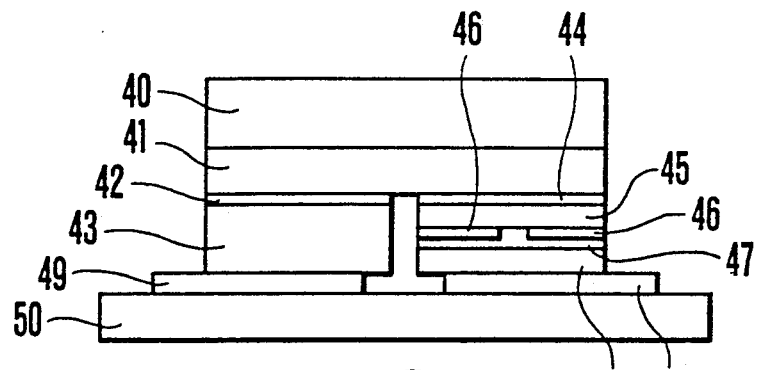
FIG. 13 is a section view showing an embodiment of a blue semiconductor light-emitting device formed on a sapphire M face.

Preferred embodiments of the present invention will be described in detail below.

[Embodiment 1]

Embodiments of a method of growing InN, GaN, AlN, and $In_xGa_{1-x}N$ and their characteristics will be described below.

(Embodiment 1—1) Formation of GaN Single Crystal Film

In this embodiment, a manufacturing apparatus shown in FIG. 2 is used to form a GaN single crystal film. Referring to FIG. 2, reference numeral 1 denotes a quartz reaction chamber; 2 and 3, metal flanges located at both the ends of the quartz reaction chamber 1 to seal the interior thereof; 4, a carbon susceptor arranged in the quartz reaction chamber 1; 5, a growth substrate arranged on the carbon susceptor 4 and having a sapphire substrate; 7, an introduction pipe, connected to an organic metal supply unit 7S, for supplying an organic metal into the reaction chamber 1; 8, an introduction pipe connected to an $H_2$ gas supply source 8S; and 9, an introduction pipe connected to an $NH_3$ gas supply source 9S.

Reference numeral 11 denotes an RF induction coil wound around the outer surface of the reaction chamber 1 at a portion corresponding to the growth substrate 5; 12, an RF power source for supplying RF power to the RF induction coil 11; 13, a thermocouple connected to the carbon susceptor 4; 14, a measurement instrument connected to the thermocouple 13; 16, an exhaust pipe connected to the metal flange 3; and 17, an exhaust pump connected to the exhaust pipe 16.

By using the apparatus having the above arrangement, the quartz reaction chamber 1 is evacuated, and $H_2$ gas is introduced from the $H_2$ gas supply source 8S to the reaction chamber 1 via the introduction pipe 8. In this state, RF power is supplied from the RF power source 12 to the RF induction coil 11, thereby heating the sapphire substrate in an $H_2$ atmosphere at 600° C. to 1,350° C. for 1 to 30 minutes. The substrate temperature is then set to be a growth temperature of 700° C. to 1,100° C., and 1 to 5 l/min of $NH_3$ gas are supplied from the introduction pipe 9. Subsequently, the temperature of an internal bubbler of the organic metal supply unit 7S is set to be −30° C. to 50° C., and trimethylgallium (TMGa) is bubbled with 10 to 100 cc/min of $H_2$ gas (or $N_2$ gas) in the bubbler and mixed in 0 to 5 l/min of an $H_2$ carrier gas (or $N_2$ carrier gas). The resultant gas mixture is supplied from the introduction pipe 7 to the quartz reaction chamber 1. A total pressure in the reaction chamber 1 during growth is adjusted to be 40 to 950 Torr. In order to compare the qualities of grown films between substrate face orientations, GaN films are simultaneously grown on sapphire M and C faces.

Figure 5:
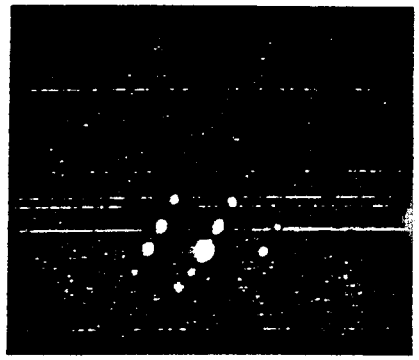
FIG. 5 is a view showing a reflection high energy electron diffraction image of GaN grown on the M face.
Figure 3A:
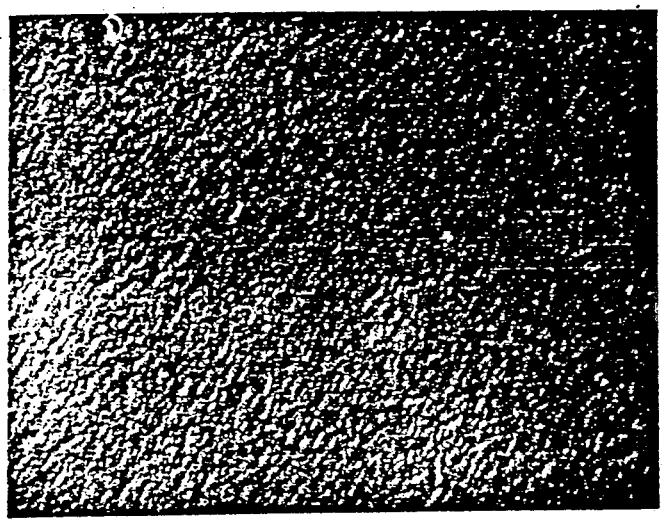
FIGS. 3A and 3B are views showing surface morphologies of GaN growth layers on sapphire M and C faces, respectively.

FIG. 3A shows a differential interference microscopic photograph of the surface of a GaN film grown on the sapphire M face substrate under the conditions of a substrate temperature of 1,000° C. and a molecular ratio of $NH_3$ to TMGa of 5,000. No characteristic patterns or $NH_3$ to TMGa of projections are found but only a flat surface is observed. In order to quantify the surface flatness, a surface profilometer was used to measure the projections on the grown film surface. The result is shown in FIG. 4A. The size of the projections of the grown layer on the M face is 50 nm or less. A reflection high energy electron diffraction (RHEED) image of the film grown on the M face is shown in FIG. 5. As shown in FIG. 5, spot-like diffraction patterns are formed, i.e., single crystals are obtained. By analyzing the RHEED patterns, it is found that GaN on the M face is oriented along the $<01\bar{1}3>$ axis.

In order to further evaluate the crystal, an etch pit density (EPD) relating to a dislocation density was measured. The method is as follows. That is, a sample is dipped in phosphoric acid at 190° C. for 5 to 30 seconds. The EPD of the GaN film on the M face was $10^8$ to $10^9/cm^2$.

Carrier concentration and hole mobility were checked as electrical characteristics. The carrier concentration of the GaN film on the M face was $1.3 \times 10^{18}/cm^3$ and its conductivity type was an n type. The mobility of the GaN film was 110 $cm^2/V \cdot s$.

Figure 6A:
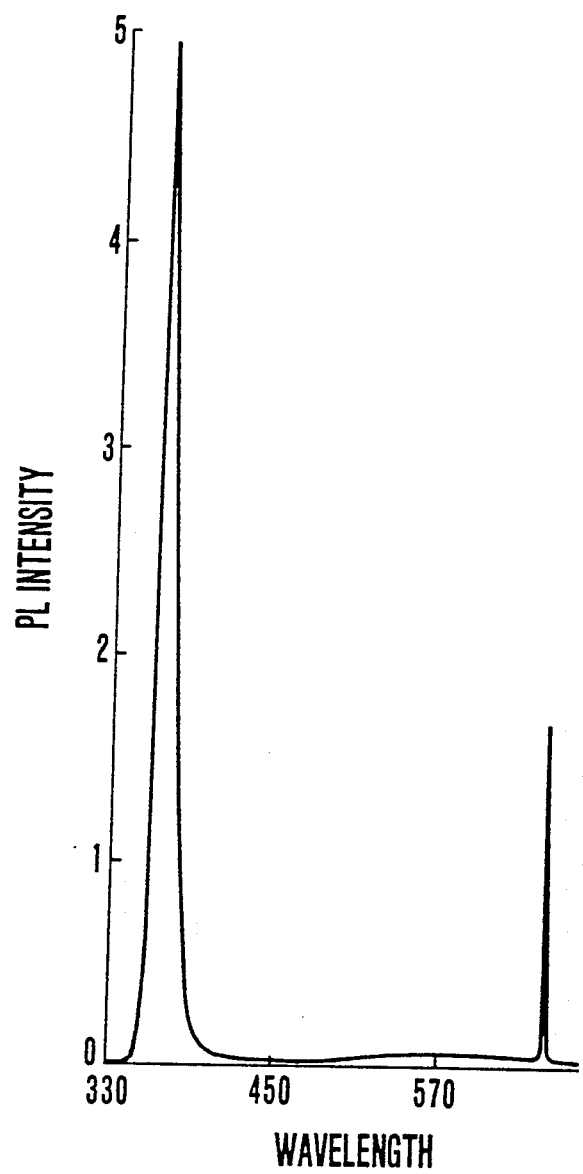
FIGS. 6A and 6B are graphs showing photoluminescence spectra of the M and C faces, respectively.

Subsequently, a photoluminescence (PL) characteristic will be described below as one of optical characteristics of the grown film. Excitation was performed by a helium-cadmium laser having a wavelength of 325 nm. A measured PL spectrum is shown in FIG. 6A.

Figure 6B:
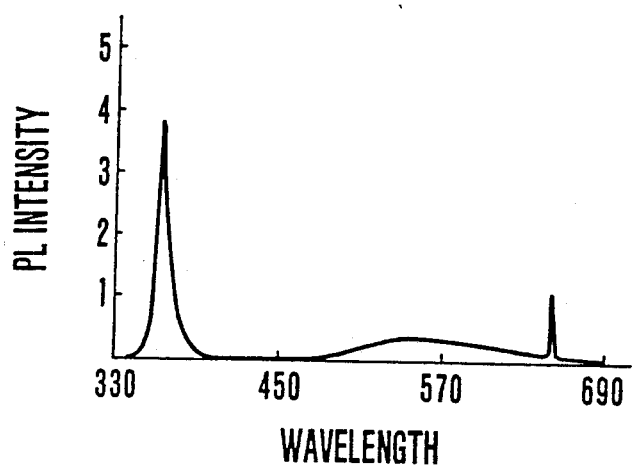
Figure 3B:

As a comparative example, the characteristics of GaN grown on a sapphire C face under the same conditions (substrate temperature = 1,000° C. and molecular ratio of $NH_3$ to TMGa = 5,000) will be described. FIG. 3B is a differential interference microscopic photograph showing the surface of GaN film grown on the sapphire C face substrate. As shown in FIG. 3B, hexagonally conical hillocks are formed to result in very poor flatness. The result obtained by measuring projections on the grown film surface by using a surface profilometer is shown in FIG. 4B. As shown in FIG. 4B, projections on the order of several μm are formed on the GaN film surface on the C face, i.e., the projections are larger than those formed on the face by 100 times or more. The EPD of the GaN film was $10^9$ to $10^{10}/cm^2$. That is, more defects such as dislocations are caused on the GaN film on the C face than on the M face. The carrier concentration of the GaN film on the C face was $5.8 \times 10^{18}/cm^3$, i.e., higher than that of the GaN film on the M face by about four times. Note that the mobility of the GaN film on the C face was 110 cm$^2$/V·s, i.e., the same as that of the GaN film on the M face. A PL spectrum of the GaN film grown on the C face is shown in FIG. 6B. The ordinates and the abscissas represent the same factors, respectively, in FIGS. 6A and 6B. As is apparent from FIGS. 6A and 6B, the PL intensity of the M face is higher than that of the C face by three times. The PL intensity is generally proportional to the carrier concentration. In this case, a difference of four times or more is present between the two carrier concentrations as described above. If, therefore, the carrier concentrations of the two faces are adjusted to be the same, the PL intensity difference is further increased four times or more. As a result, the PL intensity of the M face becomes higher than that of the C face by 20 times or more.

As described above, the characteristics of GaN can be improved much better by using the M face as a substrate than by using the C face. Note that in FIGS. 6A and 6B, the second level peak is a spectrum upon excitation.

When the growth temperature was reduced following the same procedures as described above, the grown film was polycrystallized on the sapphire C face at 900° C. or less. Single crystals, however, were obtained even at 800° C. on the sapphire M face. When growth is to be performed on a layer to which an impurity having a large diffusion constant is doped, an impurity may be diffused if the growth temperature is too high, thereby damaging an already manufactured multilayered structure. In this case, it is very advantageous to perform single crystal growth at a low temperature.

In this embodiment, TMGa is used as a Ga source gas. It is obvious, however, that a similar high-quality film can be obtained by using another organic gallium source such as triethylgallium instead of TMGa since the substrate effects remain unchanged.

(Embodiment 1-2) AlN Single Crystal Film Growth

After the quartz reaction chamber 1 is evacuated, H$_2$ gas is introduced from the H$_2$ gas supply source 8S to the chamber 1 via the introduction pipe 8. In this state, RF power is supplied from the RF power source 12 to the RF induction coil 11, thereby heating the sapphire substrate in an H$_2$ atmosphere at 600° C. to 1,350° C. for 1 to 30 minutes. The substrate temperature is then set to be a growth temperature of 700° C. to 1,100° C., and 1 to 5 l/min of NH$_3$ gas are supplied from the NH$_3$ gas supply source 9S via the introduction pipe 9. Subsequently, the temperature of the internal bubbler of the organic metal supply unit 7S is set to be $-30°$ C. to 40° C., and trimethylaluminum (TMAl) is bubbled with 10 to 100 cc/min of H$_2$ gas (or N$_2$ gas) in the bubbler and mixed in 0 to 5 l/min of H$_2$ carrier gas (or N$_2$ carrier gas). The resultant gas mixture is supplied to the quartz reaction chamber 1 via the introduction pipe 7. A total pressure in the quartz reaction chamber 1 during growth is adjusted to be 40 to 950 Torr.

Figure 7:
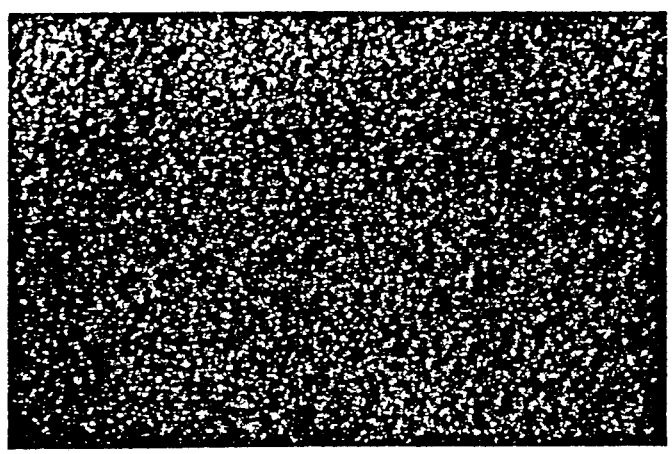
FIG. 7 is a view showing the surface of AlN grown on the M face.

FIG. 7 shows a microscopic photograph of an AlN film grown on a sapphire M face substrate under the conditions of the substrate temperature of 1,200° C. and the molecular ratio of NH$_3$ to TMAl of 5,000. As is apparent from FIG. 7, a film having very good flatness is grown. When a RHEED pattern was analyzed, it was found that a $<01\bar{1}3>$-axis oriented AlN single crystal film was formed as in the case of GaN.

In addition, no single crystal film was obtained when growth was performed on a sapphire C face following the same procedures as described above. That is, it was found that a high temperature of 1,250° C. or more was required for single crystal growth.

In this embodiment, TMAl is used as an Al source gas. It is obvious, however, that a similar high-quality film can be obtained by using another organic aluminum material such as triethylaluminum instead of TMAl since the substrate effects remain unchanged.

(EMBODIMENT 1-3) Growth of InN Single Crystal Film

After the quartz reaction chamber 1 is evacuated, H$_2$ gas is introduced from the H$_2$ gas supply source 8S via the introduction pipe 8. In this state, RF power is supplied from the RF power source 12 to the RF induction coil, thereby heating a sapphire M face substrate in an H$_2$ atmosphere at 600° C. to 1,350° C. for 1 to 30 minutes. The substrate temperature is then set to be a growth temperature of 300° C. to 800° C., and 1 to 5 l/min NH$_3$ gas are supplied from the NH$_3$ gas supply source 9S via the introduction pipe 9. Subsequently, the temperature of an internal bubbler of the organic metal supply unit 7S is set to be $-30°$ C. to 40° C., and trimethylindium (TMIn) is bubbled with 5 to 300 cc/min of H$_2$ gas (or N$_2$ gas) in the bubbler and mixed in 0 to 5 l/min of an H$_2$ carrier gas (or an N$_2$ carrier gas). The resultant gas mixture is supplied from the introduction pipe 7 to the quartz reaction chamber 1. A total pressure in the quartz reaction chamber 1 during growth is adjusted to be 40 to 950 Torr.

When a RHEED pattern was analyzed, it was found that a $<01\bar{1}3>$-axis oriented InN single crystal film was obtained as in the cases of GaN and AlN.

In this embodiment, TMIn is used as an In source gas. It is obvious, however, that a similar high-quality film can be obtained by using another organic indium material such as triethylindium instead of TMIn since the substrate effects remain unchanged.

(EMBODIMENT 1-4) Growth of In$_x$Ga$_{1-x}$N Single Crystal Film

Figure 9:
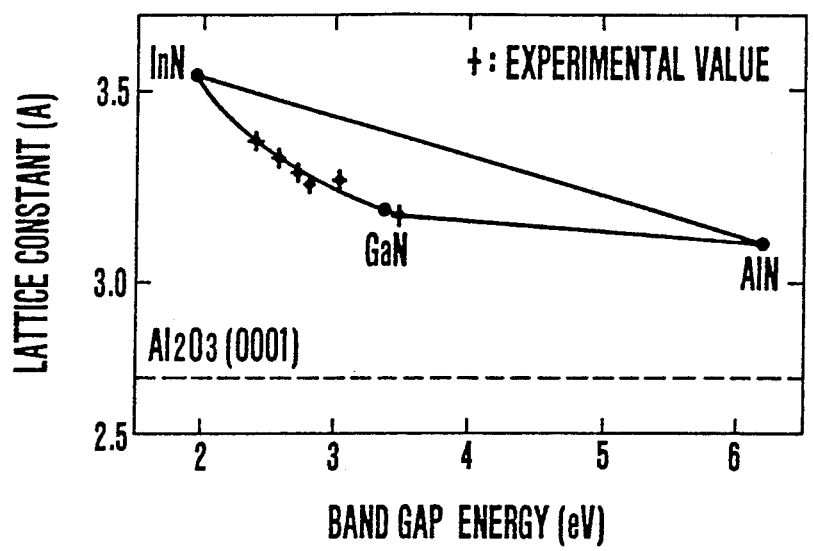
FIG. 9 is a graph showing a relationship between a band gap energy and a lattice constant of $In_xGa_{1-x}N$.

Growth of In$_x$Ga$_{1-x}$N was attempted following the same procedures as in Embodiment 1-3. A composition x was controlled by changing a supply ratio of the Group III source gases. The morphology of the surface was a mirror surface. In addition, single crystals were obtained throughout the entire composition range from InN to GaN. A relationship between the Group III gas supply ratio (TMI/TMI+TMG) and the composition x is shown in FIG. 8. As is apparent from FIG. 8, when the Group III gas supply ratio is changed, the composition x can be changed in proportion thereto. A relationship between a measured band gap energy and the composition is shown in FIG. 9. FIG. 9 also shows measurement results of InN, GaN, and AlN.

In the above embodiments 1—1 to 1-4, NH$_3$ is used as a nitrogen material. Similar results, however, can be obtained by using another N material such as N$_2$H$_4$ or an organic amine instead of NH$_3$. In addition, in each of the above embodiments, H$_2$ or N$_2$ is used as a carrier gas and a bubbling gas. Similar results, however, can be obtained by using another inert gas such as He or Ar instead of H$_2$ or N$_2$. Furthermore, in each of the above embodiments, organic gallium is used as a Ga material. It is obvious, however, that a similar high-quality film can be obtained by using a gallium halide instead of organic gallium since the substrate effects remain unchanged.

An $In_xGa_yAl_{1-x-y}N$ single crystal film can be grown following the same procedures as in the above three embodiments. In this case, by changing a composition ratio between In, Ga, and Al to change a band gap energy while a lattice constant is kept unchanged, a DH structure in which a light-emitting layer and a p- and n-type cladding layers are lattice-matched with each other can be manufactured. If a lattice constant of each layer constituting the DH structure largely differs from that of a sapphire M face, the DH structure is manufacture via an interlayer for relaxing lattice mismatching. If each layer of the DH structure is lattice-matched with the sapphire M face, the DH structure is manufactured without forming an interlayer.

EMBODIMENT 2

Figure 10A:
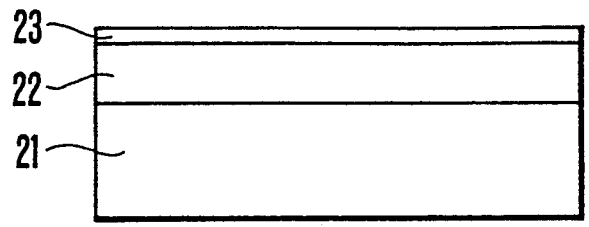
FIGS. 10A to 10E are sectional views showing manufacturing steps of a light-emitting device.
Figure 10B:
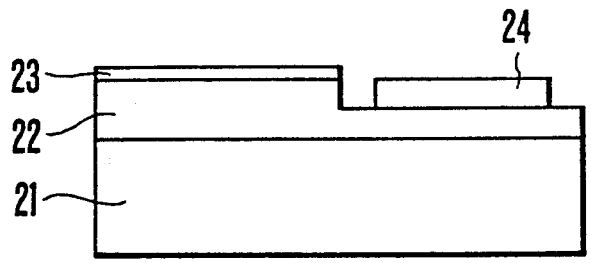
Figure 10C:
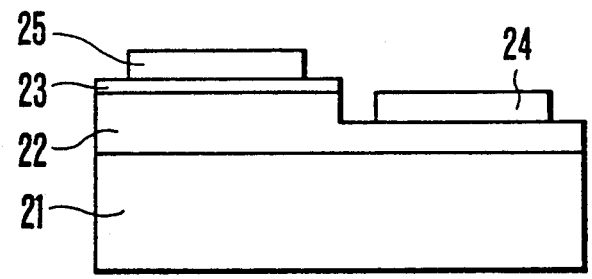
Figure 10D:
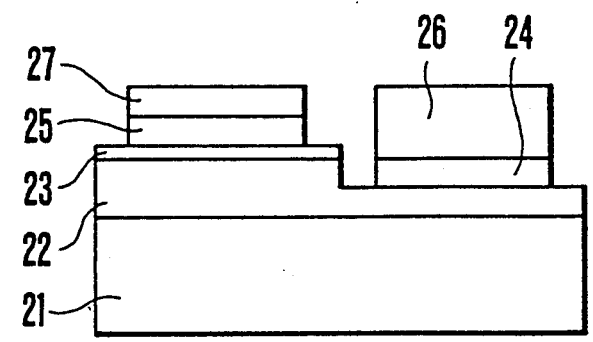
Figure 10E:
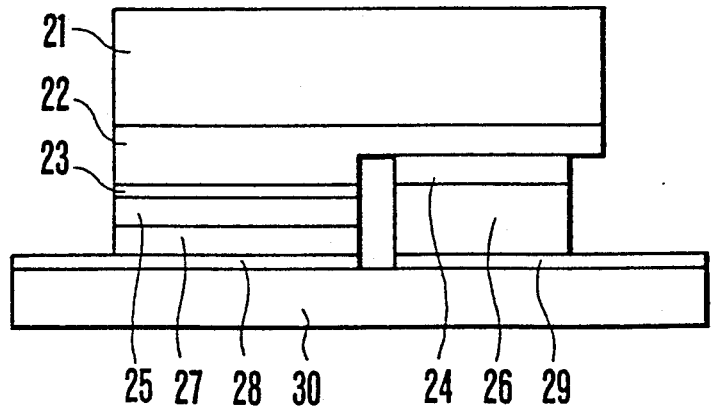

FIGS. 10A to 10E show still another embodiment of a semiconductor light-emitting device according to the present invention. With reference to FIGS. 10A to 10E, manufacturing steps and a device structure will be sequentially described below. As shown in FIG. 10A, a 3 μm thick nondoped GaN layer 22 and a 0.3 μm thick Zn-doped GaN layer 23 are grown on a 330 μm thick sapphire M face substrate 21. Then, as shown in FIG. 10B, the entire thickness of the GaN layer 23 and a partial thickness of atomic beam etching (FAB) method. Subsequently, 0.2 μm of indium and 0.1 μm of gold are continuously deposited on the Gan semiconductor layer 22 and patterned, and then treated in a hydrogen atmosphere at 400° C. for one minute, thereby forming an electrode 24. 0.2 μm of gold are deposited on the remaining GaN layer 23 and patterned, thereby forming an electrode 25 (FIG. 10C). Subsequently, in order to fuse a heat sink to the device, the electrodes 24 and 25 are gold-plated to form plating layers 26 and 27, respectively (FIG. 10D). The device is fused to a 3 μm thick stem consisting of gold-tin alloys 28 and 29 for fusing a device and an insulator 30 at 350° C. (FIG. 10E).

Note that a crystal growth apparatus used in this embodiment is the same as that shown in FIG. 2. Growth steps will be described below. First, a quartz reaction chamber 1 is evacuated by a vacuum exhaust unit. In order to clean the substrate surface, H₂ gas is introduced from an H₂ gas supply source 8S into the quartz reaction chamber 1, and an RF induction coil 11 is energized, thereby heating a carbon susceptor 4 at 600° C. to 1,350° C. for 1 to 30 minutes. After the substrate is heated, the susceptor temperature is set to be a growth temperature, and NH₃ gas is introduced from an NH₃ gas supply source 9S. In this state, H₂ gas (or N₂ gas) obtained by bubbling a Group III organic metal is introduced from an organic metal supply unit 7S into the quartz reaction chamber 1 to react the Group III organic metal with NH₃ on the substrate 5, thereby forming an epitaxial growth film on the substrate.

Figure 11:
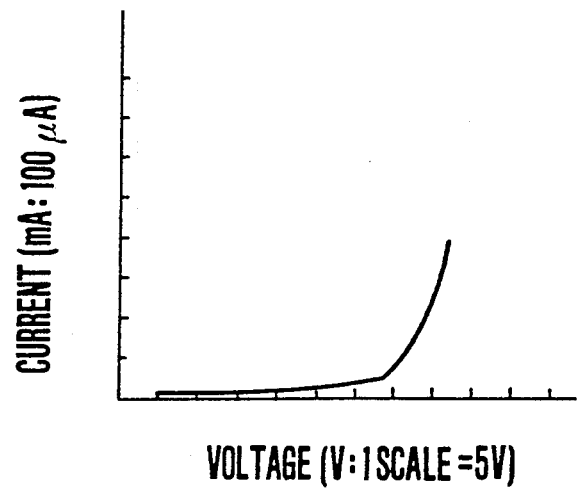
FIG. 11 is a graph showing a current-voltage characteristic of the light-emitting device.
Figure 12:
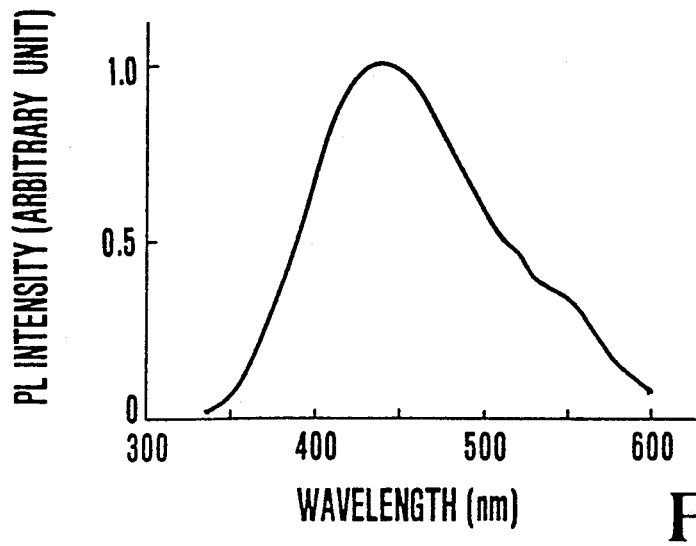
FIG. 12 is a graph showing a spectrum of emitted light.

The characteristics of the obtained device are as follows. That is, FIG. 11 shows a current-voltage characteristic curve under the forward bias. A built-in voltage is 28 V. FIG. 12 shows a spectrum of emitted light. Blue light having a central wavelength of 430 nm is emitted.

EMBODIMENT 3

Figures 14A, 14B:
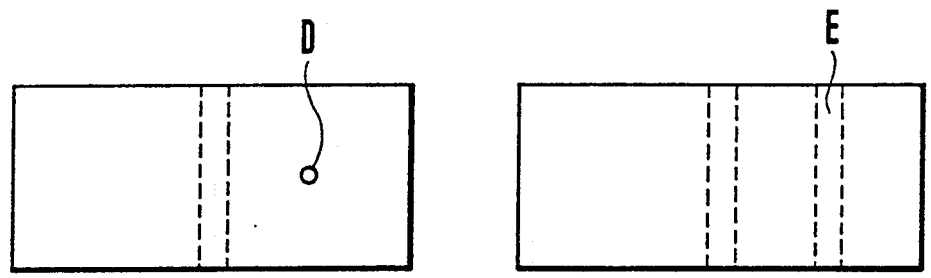
FIGS. 14A and 14B are plan views showing shapes of a p-side electrode.

FIG. 13 shows an embodiment of a blue light-emitting diode having a DH structure. Referring to FIG. 13, the diode is mounted on a heat sink by junction down. Manufacturing steps of the device are as follows. That is, an n-type $In_xGa_yAl_{1-x-y}N$ cladding layer 41, an $In_xGa_yAl_{1-x-y}N$ active layer 44 lattice-matched with the cladding layer 41 at a low carrier concentration, and a p-type $In_xGa_yAl_{1-x-y}N$ cladding layer 45 lattice-matched with the cladding layer 41 are continuously grown on a sapphire M face substrate 40. In this case, a band gap energy of the layer 44 is lower than those of the cladding layers 41 and 45. A part of the cladding layer 45, the active layer 44, or the cladding layer 41 is etched by the method described in Embodiment 2. SiO₂ is formed to have a thickness of 0.5 μm by sputtering, and an SiO₂ layer 46 is patterned as shown in FIG. 13. As a p-type ohmic electrode, Au-Zn-Ni and Au are deposited to form an electrode 47. As an n-type ohmic electrode, Au-Ge-Ni and Au are deposited to form an electrode 42. Subsequently, the resultant structure is heated in hydrogen at 500° C. for 30 seconds to alloy the deposited metals with the semiconductor layers. Gold plating is performed to form plating layers 43 and 48. Lastly, the resultant structure is mounted by junction down on a diamond heat sink 50 consisting of Ti/Pt/Au and a 3 μm thick Au-Sn coating 49. In this device, a contact portion of the electrode 47 may be limited by the SiO₂ layer 46 as shown in FIG. 14A or 14B. Note that FIG. 14A or 14B is a plan view of the device. The electrode 47 shown in FIG. 13 corresponds to D and E shown in FIGS. 14A and 14B, respectively. In this structure, injected carriers cause light emission recombination in only the active layer. Therefore, a higher luminous efficiency than that obtained when no DH structure is used can be obtained.

EMBODIMENT 4

Figure 15:
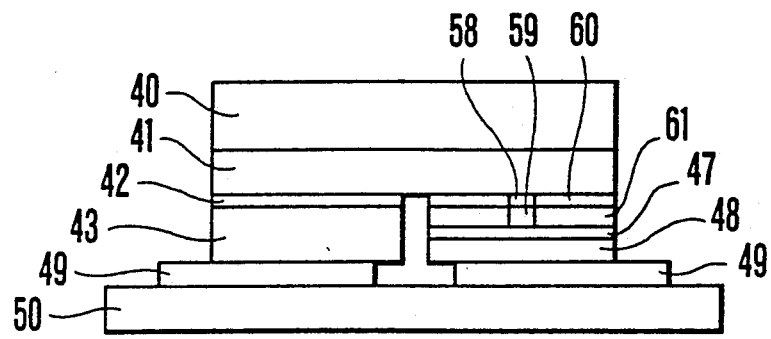
FIG. 15 is a view showing another embodiment of the blue semiconductor laser formed on a sapphire M face.
Figure 16:
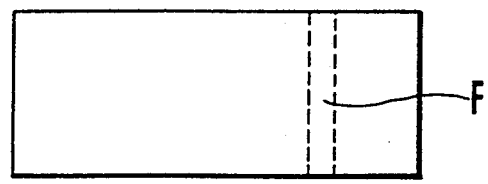
FIG. 16 is a view showing the shape of a p-side electrode.

FIG. 15 shows still another embodiment of a semiconductor laser according to the present invention and, more particularly, a blue light-emitting semiconductor laser having a buried structure. Referring to FIG. 15, the device is mounted on a heat sink by junction down. In FIG. 15, the same reference numerals as in FIG. 13 denote the same or corresponding parts. Manufacturing steps of the device are the same as those in Embodiment 3 except for a step of forming semiconductor layers 60 and 61. Therefore, only this manufacturing step will be described below. A double hetero structure is formed following the same procedures as in Embodiment 3. SiO₂ is formed on the entire surface. An SiO₂ stripe-like pattern F is formed by using photolithography as shown in FIG. 16. The resultant structure is etched as described in Embodiment 2, thereby forming a stripe consisting of an n-type $In_xGa_yAl_{1-x-y}N$ active layer 58 and a p-type $In_xGa_yAl_{1-x-y}N$ layer 59 on the pattern F portion. A buried p-type $In_xGa_yAl_{1-x-y}N$ layer 60 and a buried n-type $In_xGa_yAl_{1-x-y}N$ layer 61 are selectively grown on portions except for the pattern F portion by metalorganic vapor phase epitaxy. At this time, even if deposits are formed on the pattern F portion, they cannot be perfect crystals on SiO₂. Therefore, the deposits on the pattern F portion can be easily removed by etching. Note that the crystal of the layer 58 has the smallest band gap energy in the layers 41, 59, 60 and 61. A 3 μm thick photoresist is formed on regions except for a prospective electrode 47 formation region. The layers 60 and 61 are etched by using the method described in Embodiment 2, thereby exposing the surface of the layer 41. Thereafter, the manufacturing steps are the same as those in Embodiment 3. According to this structure, light can be confined in the active region. Moreover, a current can be blocked in the stripe region, injected carriers are confined in the active region thereby. Therefore, both light and carriers are confined in the active region. As a result, this structure is useful for a laser to be a low threshold current and high efficiency.

As has been described above, according to the present invention, since the sapphire M face is used as the crystal growth substrate, lattice mismatching can be reduced while the crystallographic symmetries of the substrate and the epitaxial growth film coincide with each other as shown in Table 1. Therefore, as compared with conventional methods using sapphire C, A, and R faces as a substrate, a high-quality $In_xGa_yAl_{1-x-y}N$ epitaxial growth film can be easily grown by simple manufacturing steps by not using a buffer layer or the like.

In addition, unlike in $ZnSe_xS_{1-x}$ or SiC and GaN using sapphire C., A, and R faces, an epitaxial growth structure in which lattice constants of layers constituting a DH structure coincide with each other can be manufactured in $In_xGa_yAl_{1-x-y}N$ on the sapphire M face. Furthermore, conductivity type control may be performed. For this reason, a high-efficiency light-emitting diode and therefore a semiconductor laser can be manufactured. Note that even if the M face slightly deviates, the same effects can be obtained.

What is claimed is:

1. An epitaxial growth structure for a semiconductor light-emitting device, comprising:
   a sapphire substrate having a substantially (01$\bar{1}$0) face (M face); and
   a wurtzite type Group III nitride mixed crystal semiconductor single crystal film epitaxially grown on said substrate.

2. A structure according to claim 1, wherein said single crystal film consists of $In_xGa_yAl_{1-x-y}N$ ($0 \leq x \leq 1$, $0 \leq x+y \leq 1$).

3. A structure according to claim 2, wherein said single crystal film is epitaxially grown in a (01$\bar{1}$3)-axial direction on said substrate.

4. A semiconductor light-emitting device comprising:
   a sapphire substrate having a substantially (01$\bar{1}$0) face (M face);
   a wurtzite type Group III nitride mixed crystal semiconductor single crystal film epitaxially grown on said substrate;
   an insulating film formed on said single crystal film; and
   a metal electrode formed on said insulating film.

5. A device according to claim 4, wherein said single crystal film consists of $In_xGa_yAl_{1-x-y}N$ ($0 \leq x \leq 1$, $0 \leq x+y \leq 1$).

6. A device according to claim 5, wherein said single crystal film is epitaxially grown in a <01$\bar{1}$3>-axial direction on said substrate.

7. A device according to claim 4, further comprising second and third wurtzite type Group III nitride mixed crystal semiconductor single crystal films arranged and epitaxially grown between said single crystal film and said insulating film, said second single crystal film having a smaller band gap energy than those of said single crystal films at both sides thereof.

* * * * *

UNITED STATES PATENT AND TRADEMARK OFFICE
CERTIFICATE OF CORRECTION

PATENT NO. : 5,006,908
DATED : April 9, 1991
INVENTOR(S) : Matsuoka et al

It is certified that error appears in the above-indentified patent and that said Letters Patent is hereby corrected as shown below:

Col. 1, Table 1, line 24, change "(0113)" to --(01$\bar{1}$3)--;

Col. 2, line 11, insert --.-- after ")";
      line 52, change "●" to --●--;
      line 53, change "○" to --○--;

Col. 6, line 21, delete "NH3 to TMGa of";
      line 62, insert --M-- before "face";

Col. 9, line 26, insert --the GaN 22 are locally etched by using a reactive fast-- before "atomic";

Col. 11, line 18, delete "." after "C".

Signed and Sealed this

Twenty-third Day of May, 1995

Attest:

BRUCE LEHMAN

*Attesting Officer*        *Commissioner of Patents and Trademarks*